United States Patent
Gobelhaider

(12) 
(10) Patent No.: US 6,747,205 B2
(45) Date of Patent: Jun. 8, 2004

(54) DEVICE FOR ASSISTING IN THE MEASUREMENT OF THE EARTH RESISTANCE

(75) Inventor: Jurgen Gobelhaider, Brunn am Gebirge (AT)

(73) Assignee: Lem Norma GmbH, Brunn am Gebirge (AT)

( * ) Notice: Subject to any disclaimer, the term of this patent is extended or adjusted under 35 U.S.C. 154(b) by 69 days.

(21) Appl. No.: 10/093,692

(22) Filed: Mar. 7, 2002

(65) Prior Publication Data

US 2002/0148624 A1 Oct. 17, 2002

(30) Foreign Application Priority Data

Mar. 8, 2001 (AT) ........................................ 174/2001 U

(51) Int. Cl.[7] ................................................. H05K 5/02
(52) U.S. Cl. .............................. 174/51; 174/50; 174/6; 191/12.2 R; 324/357; 324/9; 324/1; 324/4; 324/5; 324/6; 324/98; 324/691; 324/715; 324/354; 324/509; 379/30
(58) Field of Search ................................ 174/51, 50, 6; 191/12.2 R; 324/357, 9, 1, 4, 5, 6, 98, 691, 715, 354, 509; 379/30

(56) References Cited

U.S. PATENT DOCUMENTS

| 3,808,521 A | * | 4/1974 | Pickard et al. ............... 324/357 |
| 4,134,183 A | * | 1/1979 | Fischer .................. 24/132 AA |
| 4,379,615 A | * | 4/1983 | Toda et al. .................. 385/147 |
| 4,487,379 A | * | 12/1984 | Drechsler et al. ......... 242/375.2 |
| 5,864,093 A | * | 1/1999 | Hecock et al. ................. 174/78 |
| 5,915,641 A | * | 6/1999 | Barberg .................... 242/395.1 |
| 5,919,065 A | * | 7/1999 | Warner et al. .............. 439/789 |
| 5,950,954 A | * | 9/1999 | Bierer ..................... 242/400.1 |
| 6,137,049 A | | 10/2000 | Hecock .......................... 174/7 |

FOREIGN PATENT DOCUMENTS

| DE | 2755915 B | * | 5/1979 | .......... B65H/75/18 |
| DE | 240 582 A1 | | 11/1986 | ..................... 174/7 |
| FR | 2 668 138 | | 4/1992 | ..................... 174/7 |
| FR | 2 685 688 | | 7/1993 | ..................... 174/7 |
| WO | WO 98/45895 | | 10/1998 | ..................... 174/7 |
| WO | WO 99/27613 | | 6/1999 | ..................... 174/7 |

* cited by examiner

*Primary Examiner*—Dean A. Reichard
*Assistant Examiner*—Anton Harris
(74) *Attorney, Agent, or Firm*—Merchant & Gould, P.C.

(57) ABSTRACT

The invention relates to a device for assisting in the measurement of the earth resistance comprising a ground rod with a wire coiled up on a reel or the like, and electrical connecting means for connecting the wire to the ground rod. To provide such a device which is practical to handle, simple, small, and capable of being produced at low costs, it is provided for the reel or the like to be rotatably mounted on the ground rod. A further improvement results in that the ground rod comprises an offset portion in whose region the reel or the like is rotatably mounted. Preferably, the electrical connecting means between ground rod and wire comprise sliding rings on the rotation axis, the reel or the like. For an rapid exchangeability of the reel, the latter may be mounted on the ground rod by a snap connection.

10 Claims, 7 Drawing Sheets

DEVICE FOR ASSISTING IN THE MEASUREMENT OF THE EARTH RESISTANCE

FIELD OF THE INVENTION

The invention relates to a device for assisting in the measurement of the earth resistance comprising a ground rod with a wire coiled up on a reel or the like, and electrical connecting means for connecting the wire to the ground rod.

Measurements of the grounding resistance are an essential component of ensuring safety precautions and protective measures when producing, distributing and utilizing electric energy. These protective measures, an essential part of which is the measurement of the grounding resistance, have been laid down in national or international regulations and have to be checked at regular intervals. Measurements of the grounding resistance are, e.g., carried out on the groundings of transformers during operation thereof, high-voltage and medium-voltage towers, tracks, tank farms and boiler plants, the groundings of foundations and also lightning protectors as well as in domestic installations. For this purpose, in most cases two so-called earth rods are driven or rotated into the ground at a certain distance from each other, and they are electrically connected to a measurement instrument by a wire. A further connection will be established between the measurement instrument and the grounded object to be checked, e.g. a utility pole. In this manner, e.g., the grounding resistance of the grounded object is measured. If the value exceeds an upper limit, this is a sign of insufficient grounding.

BRIEF DESCRIPTION OF THE BACKGROUND ART

FR 2 668 138 A1, e.g., describes a means for measuring the earth resistance, comprised of several ground rods electrically interconnected by a wire via a terminal screw. Several reels on which the connecting wires are coiled up are rotatably mounted on a shaft which can be driven by a motor. The reels accommodating the connecting wires and present on the shaft are arranged in a box together with the drive motor, which box may, e.g., be positioned on the loading area of a motor vehicle. This type of arrangement is very large and complex and thus is only suitable for extensive grounding measurements in specific applications.

A ground rod comprising a connecting clamp for the wire is, e.g., known from U.S. Pat. No. 6,137,049, wherein the wire is inserted into the slot of a cap, whereupon this cap is pressed onto the upper end of the ground rod. In this manner, a reliable connection of the wire with the ground rod is achieved.

Apart from such clamping connections, the wires may also be fastened to the ground rod by clamping screws. Such ground rods are described e.g. in WO 98/45895 A1 or in WO 99/27613 A1.

SUMMARY OF THE INVENTION

The present invention has as its object to provide a device of the type indicated above, for assisting in the grounding measurement, which is practical to handle and simple, small and which can be produced at low costs. Disadvantages of known arrangements are to be avoided, or reduced, respectively.

This object is achieved according to the invention in that the reel or the like is rotatably mounted on the ground rod. This results in a simple unit which can easily be brought by the respective technical staff to the location of measurement, by rotating or driving the ground rod including the reel into the ground and subsequently uncoiling the connecting wire from the reel. Depending on the length of connecting wire required, larger or smaller reels may rotatably be mounted on the ground rod.

If the ground rod has an offset portion in whose region the reel or the like is rotatable mounted, this will result in an even more compact and space-saving device. Such ground rods provided with a reel may, e.g., be embedded in a tool box or the like provided therefor, and may be transported easily by the respective technical staff to the location of measurement.

Advantageously, the required electrical connecting means between ground rod and wire comprise sliding rings on the rotation axis of the reel or the like. Thus, the connecting wire coiled up on the reel need only be connected with the axis, or with the sliding rings, respectively, whereby automatically an electrical connection of the wire to the ground rod is provided with a rotatable connection of the reel with the ground rod. By providing appropriate electrically conductive lubricants, an increase in the conductivity over the axis can be achieved.

Alternatively, the electrical connecting means between ground rod and wire may comprise plug connections. For this purpose, the bushing may tightly be connected to the ground rod, and the plug may be electrically connected to the connecting wire. Likewise, in a manner known per se, a clamping screw may be provided on the ground rod and connected to the wire end led outside from the interior of the reel.

Advantageously, the reel or the like may be removably mounted on the ground rod. In this manner, the device for measuring the earth resistance may be made smaller, e.g. for the purpose of transportation. Moreover, it is also possible to connect differently sized reels comprising different lengths of wires to one and the same ground rod.

The releasable mounting of the reel on the ground rod advantageously is effected via a snap connection so that the connection can be made quickly and easily.

For an easier coiling of the wire, the reel or the like preferably comprises a crank capable of being removed or folded up. Thereby the wire can be coiled up more easily and more quickly. This removability or pivotability again facilitates transportation of the device, since a more compact unit will be formed.

For longer wires, it may be suitable for the reel or the like to be provided with a drive means, e.g. a coiling spring. By such a measure, coiling up of the wire is substantially facilitated.

The invention will be further explained in more detail by way of the drawings which illustrate an embodiment of the invention.

DESCRIPTION OF THE PREFERRED EMBODIMENTS

Figure 1A:
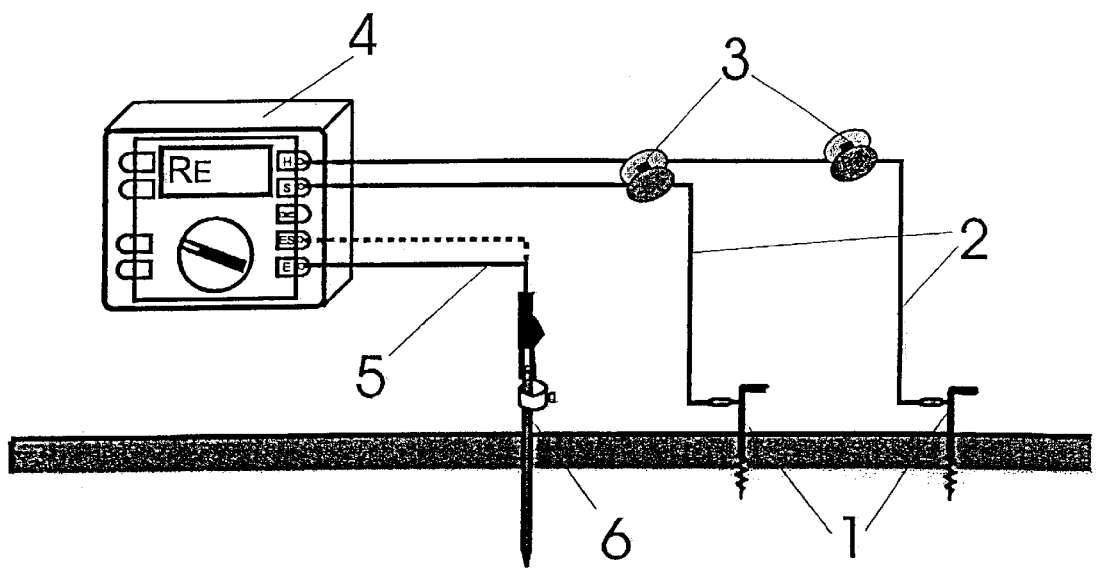
FIGS. 1a and 1b outline the principle of grounding measurement procedures according to the prior art.

FIG. 1a shows an outline of the principle of a grounding measurement at a grounded object or apparatus 6, e.g. a utility pole. In doing so, two ground rods 1 are rotated or driven into the ground at a certain distance from each other. The ground rods 1 are connected via a wire 2 with a measuring device 4, the wire 2 in most instances being coiled up on a reel 3 and being uncoiled according to the respective requirements. The object or apparatus 6 to be measured also is connected with the measuring device 4 via a wire 5. Via one of the two ground rods 1, the so-called auxiliary earthing electrode, a measuring current is fed, while via the other ground rod 1, the so-called probe, the voltage drop on the resistance occurring between this ground rod and the apparatus 6 is measured, wherein it is possible to draw conclusions on the resistance by knowing the impressed current and the measured voltage drop. If the line between the measuring device 4 and the object or apparatus 6 to be measured are too long, the voltage drop occurring through this line can be compensated according to the known alternative four-pole measurement method (entered in broken lines) with the assistance of an additional measuring line. This eliminates an error of the measured result by the resistance of the measuring line 5. If an excessive resistance value is measured with the assistance of the measuring device 4, this value indicates an insufficient grounding of the grounded object or apparatus 6.

Figure 1B:
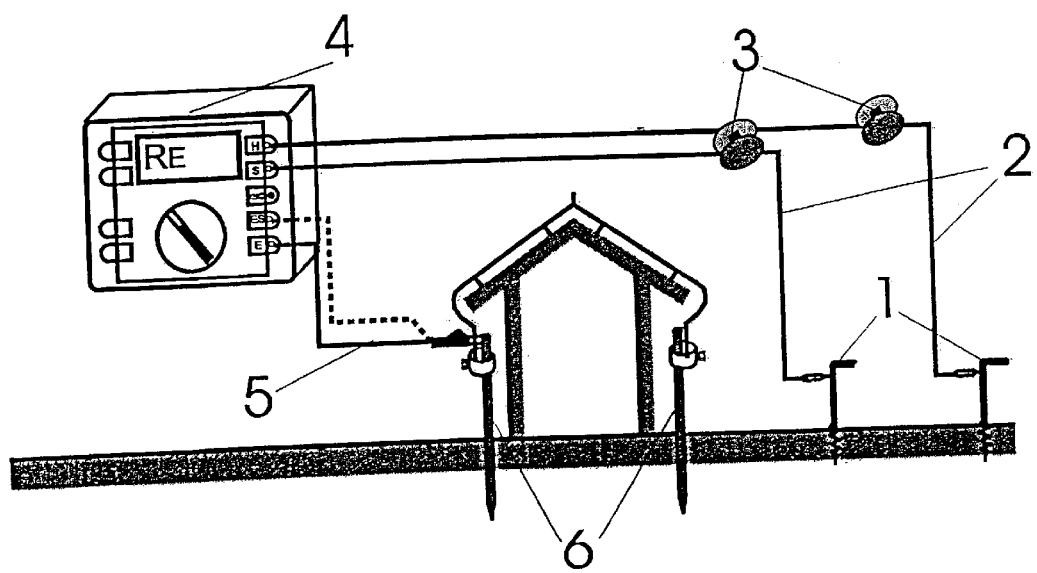

FIG. 1b shows the principle of a grounding measurement at the lightning protector of a house. Otherwise, the measurement is analogous to that of FIG. 1a.

Figure 2:
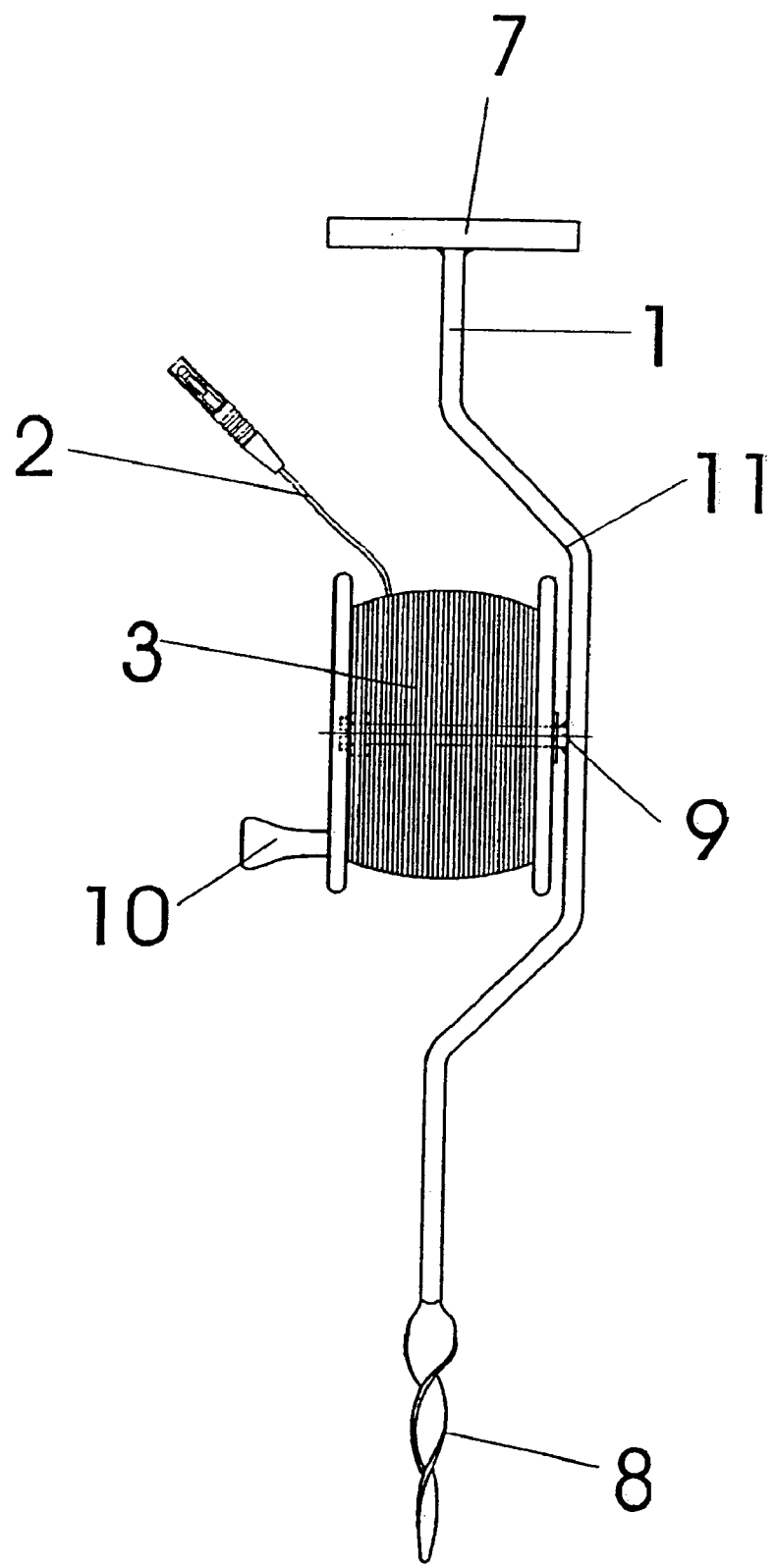
FIG. 2 shows a side view of an embodiment of a device according to the invention.

FIG. 2 shows a side view of an embodiment of a device according to the invention, comprised of a ground rod 1 which has a handle 7 for a greater ease of handling and a tip, a thread 8 or the like at its end to be driven into the ground. The reel 3 with the wire 2 coiled up thereon is rotatably mounted on the ground rod 1. For this purpose, a rotation axis 9 is fastened to the ground rod 1, e.g. welded thereto. For an easier coiling up of wire 2, the reel 3 has a crank handle 10 fastened thereto which preferably can be removed or folded up against the forward reel disk, so that the device will be very compact. The device is also particularly compact and good to handle by the fact that the ground rod 1 has an offset portion 10 in the range of which the reel 3 or the like is rotatably mounted.

Figure 3:
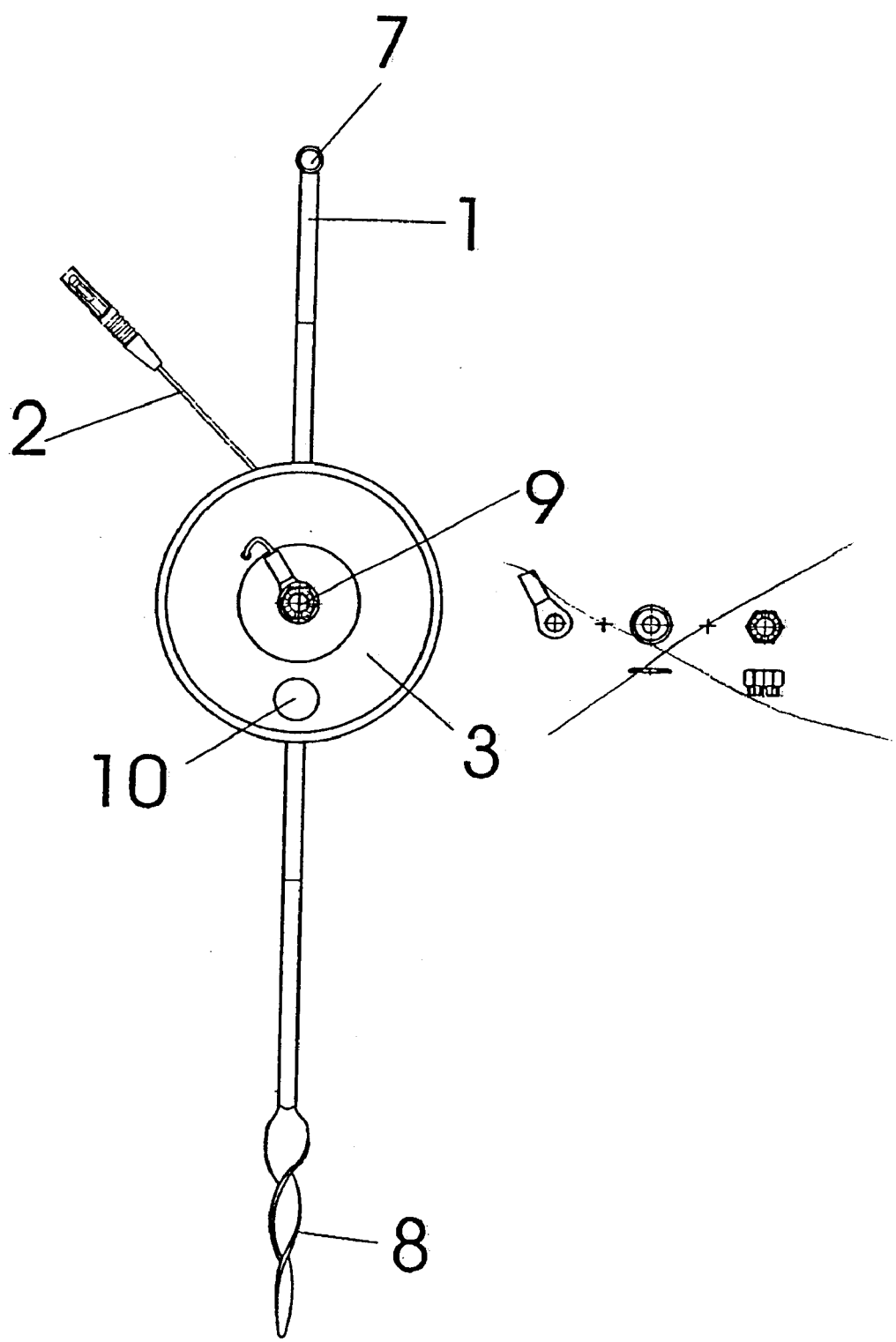
FIG. 3 shows a view on the device according to FIG. 2, seen from the front.

As can be taken from FIG. 3, the reel 3 is cylindrically designed, yet it may also have an elliptical or oval cross-section. Sometimes such an embodiment is advantageous in terms of the space requirements, e.g. if the arrangement is to be housed in a box for transportation purposes.

To make the electrical connection between the wire 2 on the reel 3 or the like and the ground rod 1, a free end of the wire 2 may be led to outside of the reel 3 or the like and may be connected with the rotation axis 9 via a screw connection, e.g.

Figure 4:
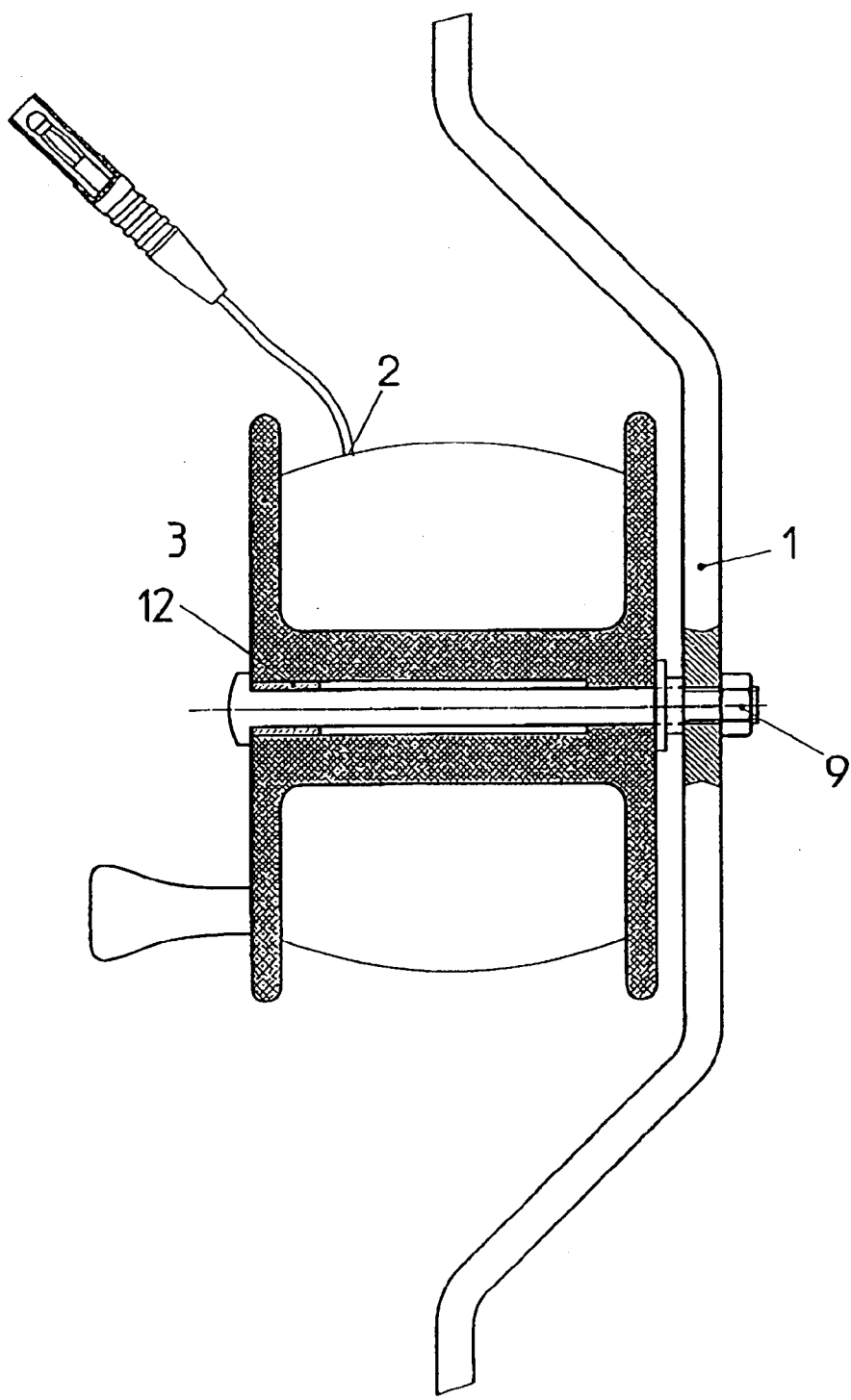
FIGS. 4 to 6 show detailed views, partially sectioned, of various embodiments for electrically connecting wire and ground rod.

FIG. 4 shows one possible way of making the electrical connection between the wire 2 on the reel 3 or the like and the ground rod 1 which may be effected via sliding rings 12 and the rotation axis 9.

Figure 5:
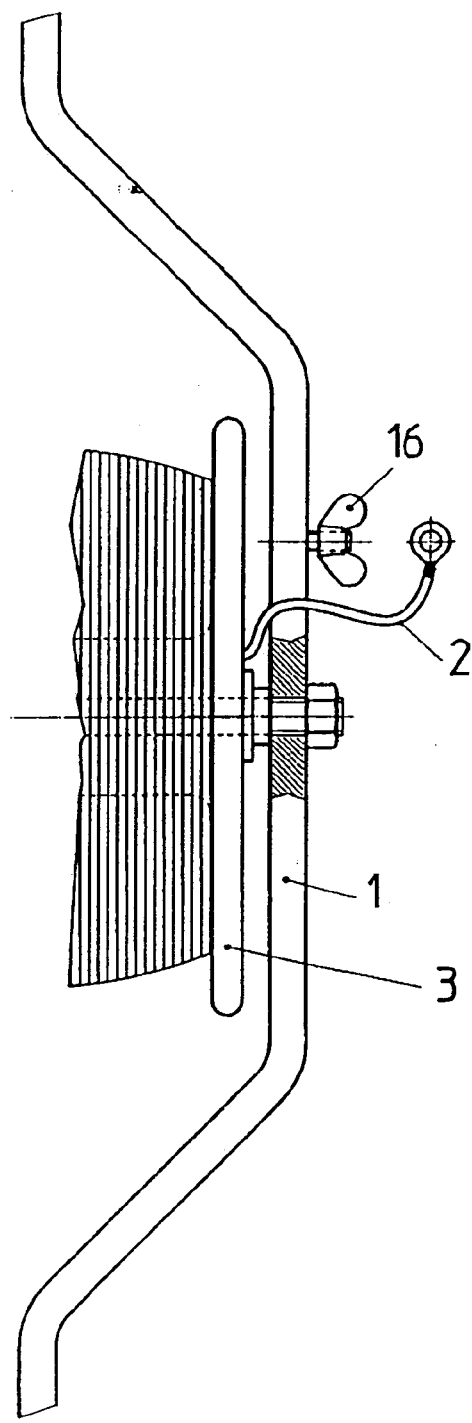

FIG. 5 shows a further embodiment in which the inner end of the wire 2 coiled up on the reel 3 or the like, after uncoiling of the required wire length by rotating the reel 3 is electrically connected with the ground rod 1 via a clamping screw 16.

Figure 6:
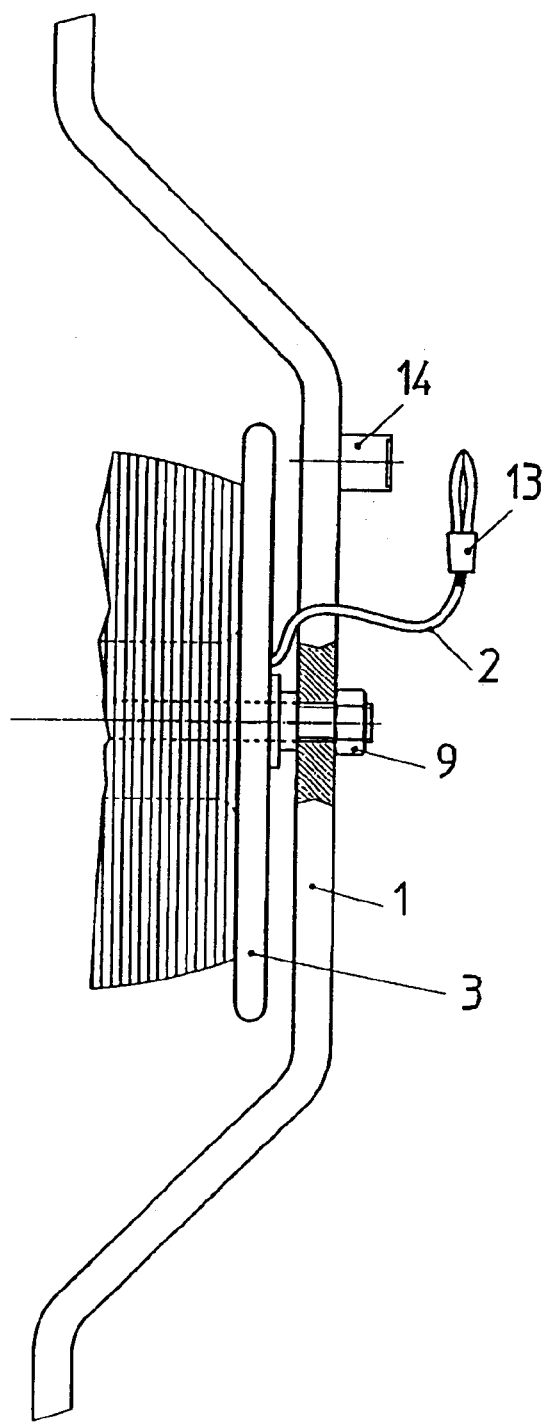

According to FIG. 6, this connection may also be made by a plug connection, with a plug 13 being connected to the free end of wire 2, and a bushing 14 being connected to the ground rod 1, which are plugged together if required.

Figure 7:
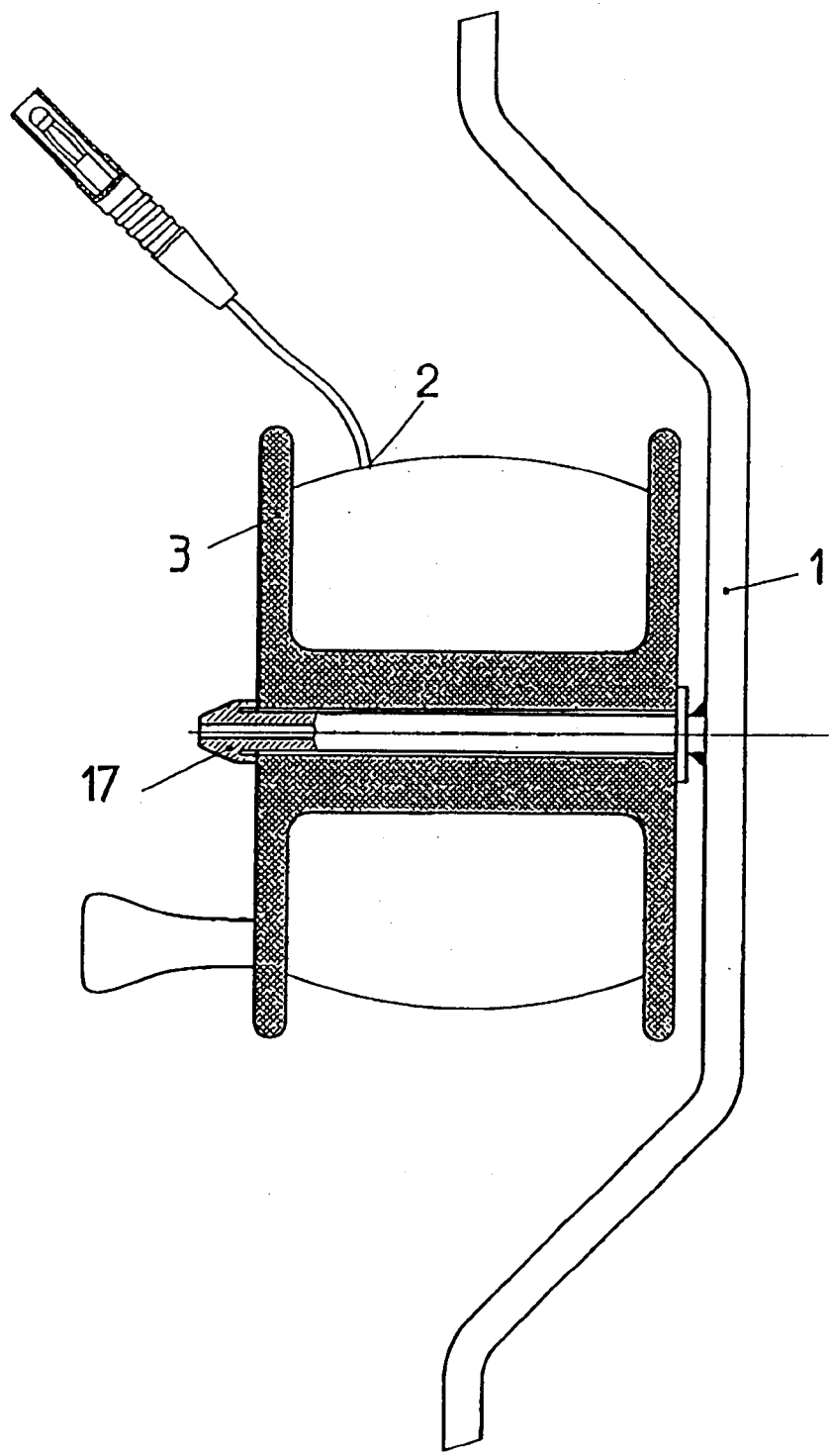
FIG. 7 shows an embodiment of a snap closing means for releasable mounting of the reel on the ground rod.

FIG. 7 shows an embodiment of a releasable mechanical connection between reel 3 and ground rod 1, the rotation axis being designed with a snap connection means 17, to which reel 3 may simply be slipped on. In this manner, different reels 3 with different wires 2, in particular with different lengths of wires, may be exchanged easily and slipped onto ground rod 1.

Finally, a drive means (not illustrated) may be provided for the reel, which will assist in the coiling up of the cable. This drive means may, e.g., be formed by a coiling up spring which will be tensioned in a similar way as in a window blind and, when actuating a button which will, e.g., unlock a serrated latch lock, will assist in coiling up of the wire on the reel. However, also other drive means, such as, e.g., battery-operated motors or the like, are possible.

The described device for measuring the earth resistance is characterized by being particularly compact, simple and capable of being produced at low costs.

What I claim is:

1. A device for assisting in measuring the earth resistance, said device comprising a ground rod, a reel rotatably mounted on the ground rod, and a wire coiled up on said reel, and electrical connecting means for connecting said wire to said ground rod, wherein said ground rod has an offset portion, said reel being rotatably mounted to said ground rod at said offset portion.

2. A device as set forth in claim 1, wherein said reel has a rotation axis and said electrical connecting means between said ground rod and said wire include sliding rings located on said rotation axis of said reel.

3. A device as set forth in claim 1, wherein said electrical connecting means between said ground rod and said wire comprise plug connection elements.

4. A device as set forth in claim 1, wherein said reel is removably mounted on said ground rod.

5. A device as set forth in claim 4, wherein said reel is removably mounted on said ground rod via a snap connection.

6. A device as set forth in claim 1, wherein said reel includes a crank.

7. A device as set forth in claim 6, wherein said crank is capable of being removed.

8. A device as set forth in claim 6, wherein said crank is capable of being folded up.

9. A device as set forth in claim 1, further comprising a drive means provided for said reel.

10. A device as set forth in claim 9, wherein said drive means for said reel is a coiling-up spring.

* * * * *